United States Patent
Fetter et al.

(10) Patent No.: US 6,675,450 B1
(45) Date of Patent: Jan. 13, 2004

(54) METHOD OF MANUFACTURING AND MOUNTING ELECTRONIC DEVICES TO LIMIT THE EFFECTS OF PARASITICS

(75) Inventors: Linus Albert Fetter, Morganville, NJ (US); Yiu-Huen Wong, Summit, NJ (US); Michael George Zierdt, Belle Mead, NJ (US)

(73) Assignee: Agere Systems Guardian Corp., Allentown, PA (US)

( * ) Notice: Subject to any disclaimer, the term of this patent is extended or adjusted under 35 U.S.C. 154(b) by 379 days.

(21) Appl. No.: 09/698,175

(22) Filed: Oct. 30, 2000

(51) Int. Cl.[7] .............................................. H04R 17/00
(52) U.S. Cl. ..................... 29/25.35; 29/846; 29/847; 216/13; 252/62.9 R
(58) Field of Search ................................ 29/25.35, 829, 29/846, 847; 216/13; 252/62.9 R; 174/250, 260; 361/748–751

(56) References Cited

U.S. PATENT DOCUMENTS

| | | |
|---|---|---|
| 4,502,932 A | 3/1985 | Kline et al. |
| 4,556,812 A | 12/1985 | Kline et al. |
| 4,719,383 A | 1/1988 | Wang et al. |
| 4,890,370 A | 1/1990 | Fukuda et al. |
| 4,988,957 A | 1/1991 | Thompson et al. |
| 5,075,641 A | 12/1991 | Weber et al. |
| 5,166,646 A | 11/1992 | Avanic et al. |
| 5,231,327 A | 7/1993 | Ketcham |
| 5,232,571 A | 8/1993 | Braymen |
| 5,263,259 A | 11/1993 | Cimador |
| 5,266,520 A * | 11/1993 | Cipolla et al. ............... 427/96 |
| 5,283,458 A | 2/1994 | Stokes et al. |
| 5,294,898 A | 3/1994 | Dworsky et al. |
| 5,303,457 A | 4/1994 | Falkner, Jr. et al. |
| 5,334,960 A | 8/1994 | Penunuri |
| 5,348,617 A | 9/1994 | Braymen |
| 5,367,308 A | 11/1994 | Weber |
| 5,373,268 A | 12/1994 | Dworsky et al. |
| 5,381,385 A | 1/1995 | Greenstein |
| 5,403,701 A | 4/1995 | Lum et al. |
| 5,404,628 A | 4/1995 | Ketcham |
| 5,438,554 A | 8/1995 | Seyed-Bolorforosh et al. |
| 5,446,306 A | 8/1995 | Stokes et al. |
| 5,552,655 A | 9/1996 | Stokes et al. |
| 5,587,620 A | 12/1996 | Ruby et al. |
| 5,596,239 A | 1/1997 | Dydyk |
| 5,617,065 A | 4/1997 | Dydyk |
| 5,630,949 A | 5/1997 | Lakin |
| 5,646,583 A | 7/1997 | Seabury et al. |
| 5,692,279 A | 12/1997 | Mang et al. |
| 5,698,928 A | 12/1997 | Mang et al. |

(List continued on next page.)

Primary Examiner—Timothy V. Eley
(74) Attorney, Agent, or Firm—Harness, Dickey & Pierce, P.L.C.

(57) ABSTRACT

A method of producing and mounting electronic devices to negate the effects of parasitics on device performance. In one aspect, the substrate surface of the device is coated with a thin, etch-resistant film during fabrication that acts as a barrier to allow removal of substrate material beneath the film, creating a suspended structure upon which the remaining layers of circuitry rest. Alternatively the device is made with a film that is integral to the device, and that acts as the supporting membrane. To mount the device on a carrier or package, solder bumps are applied near the ends of the conductors of the device, and the die is then secured to a carrier or package, and positioned so that leads extending from the conductors mate up with bonding strips on the carrier or package. The solder bumps are then reflowed or melted to establish electrical connection between leads of the device and corresponding bonding strips of the carrier. The resultant electronic device is essentially immune to the effects or parasitic capacitanaces and parasitic inductances, with the device as mounted being further configured so as to tune out any residual parasitics which may still exist after fabrication.

26 Claims, 6 Drawing Sheets

U.S. PATENT DOCUMENTS

| | | | | |
|---|---|---|---|---|
| 5,702,775 A | | 12/1997 | Anderson et al. | |
| 5,704,116 A | * | 1/1998 | Gamota et al. | 29/840 |
| 5,714,917 A | | 2/1998 | Ella | |
| 5,760,663 A | | 6/1998 | Pradal | |
| 5,780,713 A | | 7/1998 | Ruby | |
| 5,789,845 A | | 8/1998 | Wadaka et al. | |
| 5,821,833 A | | 10/1998 | Lakin | |
| 5,853,601 A | | 12/1998 | Krishaswamy et al. | |
| 5,864,261 A | | 1/1999 | Weber | |
| 5,872,493 A | | 2/1999 | Ella | |
| 5,873,153 A | | 2/1999 | Ruby et al. | |
| 5,873,154 A | | 2/1999 | Ylilammi et al. | |
| 5,883,575 A | | 3/1999 | Ruby et al. | |
| 5,884,378 A | | 3/1999 | Dydyk | |
| 5,894,647 A | | 4/1999 | Lakin | |
| 5,910,756 A | | 6/1999 | Ella | |
| 5,928,598 A | | 7/1999 | Anderson et al. | |
| 5,942,958 A | | 8/1999 | Lakin | |
| 5,963,856 A | | 10/1999 | Kim | |
| 6,051,907 A | | 4/2000 | Ylilammi | |
| 6,060,818 A | | 5/2000 | Ruby et al. | |
| 6,081,171 A | | 6/2000 | Ella | |
| 6,087,198 A | | 7/2000 | Panasik | |
| 6,127,768 A | | 10/2000 | Stoner et al. | |
| 6,131,256 A | * | 10/2000 | Dydyk et al. | 29/25.35 |
| 6,150,703 A | | 11/2000 | Cushman et al. | |
| 6,185,589 B1 | | 2/2001 | Votipka | |
| 6,198,208 B1 | | 3/2001 | Yano et al. | |
| 6,204,737 B1 | | 3/2001 | Ella | |
| 6,215,375 B1 | | 4/2001 | Larson, III et al. | |
| 6,278,342 B1 | * | 8/2001 | Ella | 333/189 |
| 6,323,744 B1 | * | 11/2001 | Barber et al. | 333/189 |
| 6,355,498 B1 | * | 3/2002 | Chan et al. | 438/48 |
| 6,546,620 B1 | * | 4/2003 | Juskey et al. | 29/840 |
| 2002/0170746 A1 | * | 11/2002 | Master et al. | 174/256 |
| 2003/0037959 A1 | * | 2/2003 | Master et al. | 174/256 |

* cited by examiner

METHOD OF MANUFACTURING AND MOUNTING ELECTRONIC DEVICES TO LIMIT THE EFFECTS OF PARASITICS

FIELD OF THE INVENTION

The present invention relates to electronic devices, more particularly to methods for manufacturing and mounting electronic devices such as thin film resonators (TFRs) to limit parasitic effects.

DESCRIPTION OF THE RELATED ART

Electronic devices such as thin film resonators (hereinafter "TFR") are typically used in high-frequency, high-power environments ranging from several hundred megahertz (MHz) to several gigahertz (GHz). FIG. 1 illustrates a side view or cross-section of a typical TFR component 100. In FIG. 1, TFR component 100 includes a piezoelectric material 110 interposed between two conductive electrode layers 105 and 115, with electrode layer 115 formed on a support structure 120. The support structure 120 may be a membrane, or may be a plurality of alternating reflecting layers on a solid semiconductor substrate which may be made of silicon or quartz, for example. The piezoelectric material is preferably one selected from the group comprising at least ZnO, CdS and AlN. Electrode layers 105 and 115 are formed from a conductive material, preferably of Al, but may be formed from other conductors as well.

TFRs are often used in electronic signal filters, more particularly in TFR filter circuits applicable to a myriad of communication and microelectronic technologies. For example, TFR filter circuits may be employed in cellular, wireless and fiber-optic communications, as well as in computer or computer-related information-exchange or information-sharing systems.

The piezoelectric material in TFR resonators converts electrical to mechanical energy and vice versa, such that at its mechanical resonance frequency, the electrical behavior of the device abruptly changes. Electrical signals of particular frequencies easily pass thorough the resonators, while others will not be transmitted. These particular frequencies can typically be dictated by choosing resonator size and design. Resonators of certain sizes and design frequencies can be networked in appropriate combinations, such that they will impose desired filtering functions on signals passing through the network.

A standard approach to designing filters out of resonators is to arrange them out of simple building blocks such as in a ladder configuration, that is, in an alternating series-shunt relationship. A series element in this sense carries signal from an input toward an output, whereas a shunt element provides an alternative path for the signal to ground. The transmission or blocking characteristics of both series and shunt elements affect the final signal reaching output from input, somewhat analogous to how branching of water pipes can affect the flow through the main water line.

FIG. 2 illustrates schematically this simple building block, commonly known as a T-Cell. Referring specifically to FIG. 2, a schematic of a T-Cell building block 200 includes three TFR components 210, 220 and 230. TFR components 210 and 220 comprise the "series arm" portion of the T-Cell block, being connected in series between an input port 215 and an output port 225 of T-Cell 200. TFR component 230 comprises the "shunt leg" portion of T-Cell 200, being connected in shunt between node 235 and ground. A TFR T-Cell itself may define a filter; although a TFR ladder filter typically has a plurality of these T-cells concatenated together.

As can be seen from FIG. 1, many electronic devices fabricated today using planar technologies are built on silicon wafers. In some of these devices, only the first few microns of the wafer's bulk or thickness are involved in the device's performance. In other devices, this wafer serves only as a mechanical support.

As will described in further detail below, the manufacturing process for many electronic devices, a TFR being just one exemplary device, often entails the deposition and patterning of several metallic layers that in a final form serve as intergral parts of the device, and/or as interconnects between these integral parts.

One of the most serious and persistent problems regarding the above device is the effects of parasitic capacitances and inductances on device performance. These parasitics are typically created by interactions between the substrate and the layers forming the device; and/or these parasitic capacitances and inductances are already present in the connecting layers within the device. In general, any pair of conducting or semi-conducting plates separated by a dielectric material may act as a capacitor, and any strip of conducting material may act as an inductor. Such structures are often included as part of a circuit's design. However, these structures may also occur incidentally as part of a circuit's physical layout.

FIG. 1(b) illustrates parasitic capacitors which could be present within the TFR device of FIG. 1(a). FIG. 1(b) is essentially the TFR of FIG. 1(a), but illustrates capacitors which may be intended in its design (see at 125); and those capacitors which may be incidental to the TFR's layout (see at 130). These incidental (i.e., parasitic) capacitors, resulting from interactions between the device structure and the substrate, tend to degrade device performance and should be accounted for and limited. Accordingly, what is needed is a method of manufacturing electronic devices such as TFRs that do not suffer from the detrimental effects that parasitics currently have on device efficiency and performance.

SUMMARY OF THE INVENTION

The present invention provides a method of manufacturing electronic devices that have at least a portion of their supporting substrate removed to eliminate parasitic capacitance. In another aspect of the invention, a mounting technique for mounting the aforementioned electronic device is described for tuning out any residual parasitics.

In one embodiment, after providing the substrate, the substrate surface is coated with a thin, etch-resistant film. The film acts as a barrier to allow removal of at least some of the substrate material during subsequent manufacturing steps, creating a suspended structure upon which the remaining layers of circuitry rest. In another embodiment, a film which is an integral part of the device acts as the supporting membrane.

Regarding the mounting method, solder bumps are applied near the ends of conductors or electrodes of the manufactured device. The completed die (surface on which the substrate/membrane and device circuitry rest) is then inserted vertically and/or edge-on into a carrier or package that is to include the device, and the solder bumps are reflowed (i.e., melted with a conventionally used heat source) to establish contact with corresponding bonding strips on the carrier. Both the manufacturing and mounting techniques may reduce and/or eliminate the adverse effects of parasitics, since these membrane-supported devices suffer from essentially no parasitic capacitance, and little if any parasitic inductance.

BRIEF DESCRIPTION OF THE DRAWINGS

The present invention will become fully understood from the detailed description given hereinbelow and the accompanying drawings, wherein like elements represent like reference numerals, which are given by way of illustration only and thus are not limitative of the invention and wherein.

DETAILED DESCRIPTION

Figure 1A:
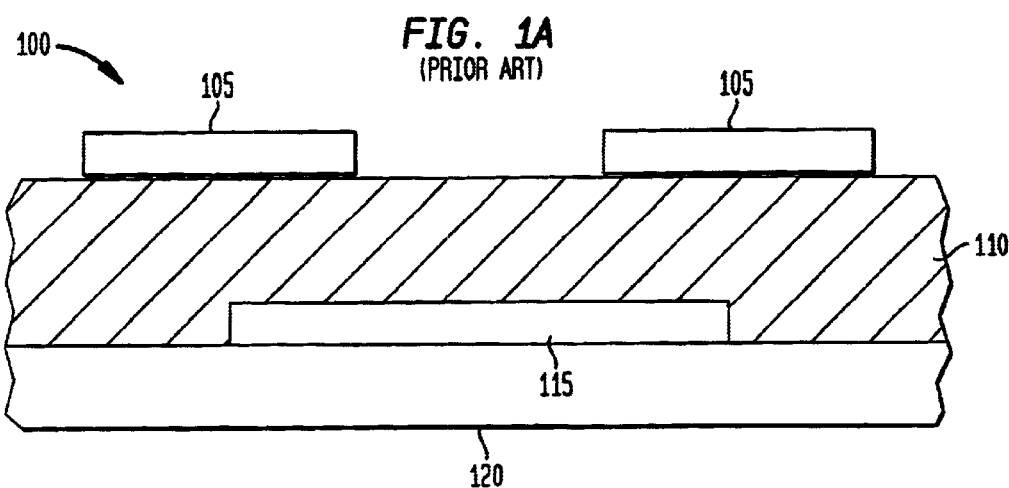
FIG. 1(a) illustrates a cross-section of a typical electronic device such as a thin film resonator (TFR) device.
Figure 1B:
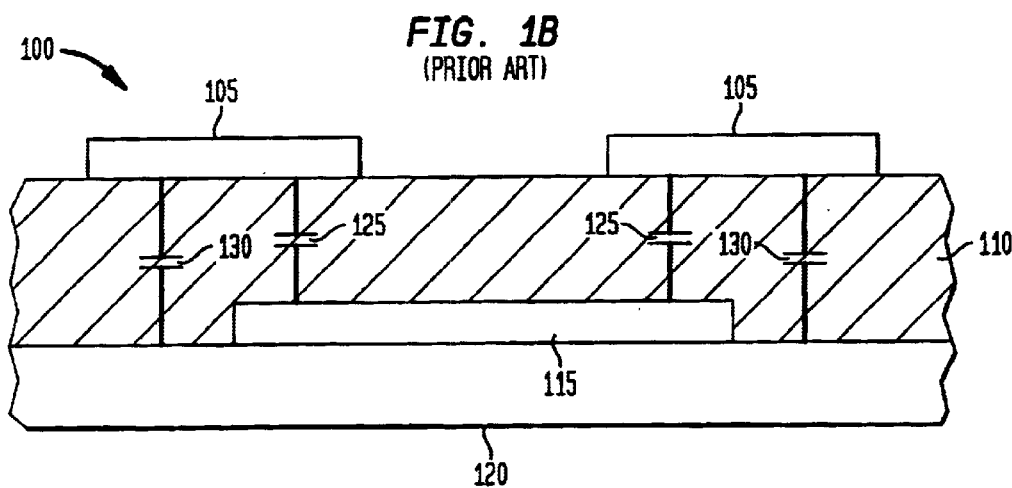
FIG. 1(b) illustrates the parasitic capacitors present in the TFR of FIG. 1(a)
Figure 2:
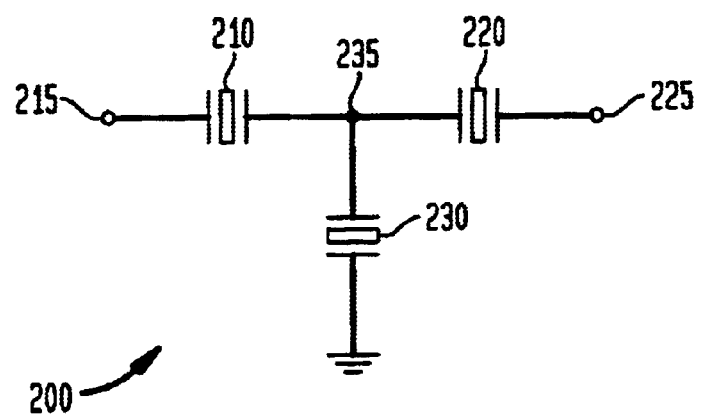
FIG. 2 illustrates a T-cell building block.

The present invention provides a method of producing and a method of mounting electronic devices that are supported by a thin membrane rather than a bulk substrate. Each method contributes to the reduction and/or elimination of electronic parasitics such as parasitic inductances a,and parasitic capacitances. In one aspect of fabrication, the substrate surface of the device is coated with a thin, etch-resistant film which acts as a barrier to allow removal of at least some of the substrate material during subsequent manufacturing steps, creating a suspended membrane upon which the remaining layers of circuitry rest. In another aspect, a thin film that is integral with the device may support the device, so that no additional etch-resistant film is required during fabrication. In either case, substantial elimination of substrate parasitics is accomplished when, as a final production step, some or substantially all of the substrate material is removed in an etchant.

To mount the device, solder bumps (i.e., small balls of conducting metal material having a low melting point) are applied near the ends of the conductors or electrodes of the device. The completed die on which the membrane-mounted device rests is secured into a carrier or package that is to contain the device. The solder bumps are then reflowed to establish contact between leads of the electrodes and corresponding bonding strips on the carrier.

The resultant membrane mounted electronic device has a substantially reduced presence of parasitics and/or parasitic effects than current electronic devices, since these parasitics are induced by the very presence of the bulk supporting substrate on which conventional electronic devices rest. Since a substantial portion of the substrate is removed, any parasitics which could have been induced therein are effectively eliminated with the removal of substrate material. Further, any residual parasitics that might still be present in the membrane are further eliminated when the device is mounted in a "tuning" carrier or package, i.e., these parasitics can be electronically eliminated or tuned out.

Accordingly, these membrane-supported devices suffer from essentially no parasitic capacitance, and from little parasitic inductance. As will be described below, capacitors and inductors arranged on the carrier's surface may also be implemented in order to tune out any remaining parasitics. In other words, the resultant electronic device is essentially immune to the effects or parasitic capacitanaces and parasitic inductances, with the mounted device being configurable so as to tune out any residual parasitics that may still exist after fabrication.

Although the below discussion focuses on the fabrication of a thin film resonator (TFR) device, the method of manufacturing and method of mounting in accordance with the present application is not limited to such a device. As may be recognized by those having ordinary skill in the art, the present application is applicable to any electronic device which has a wafer-like substrate or membrane, and/or which is manufactured using a series of deposition and patterning steps to form integral layers of the device.

Figure 3:
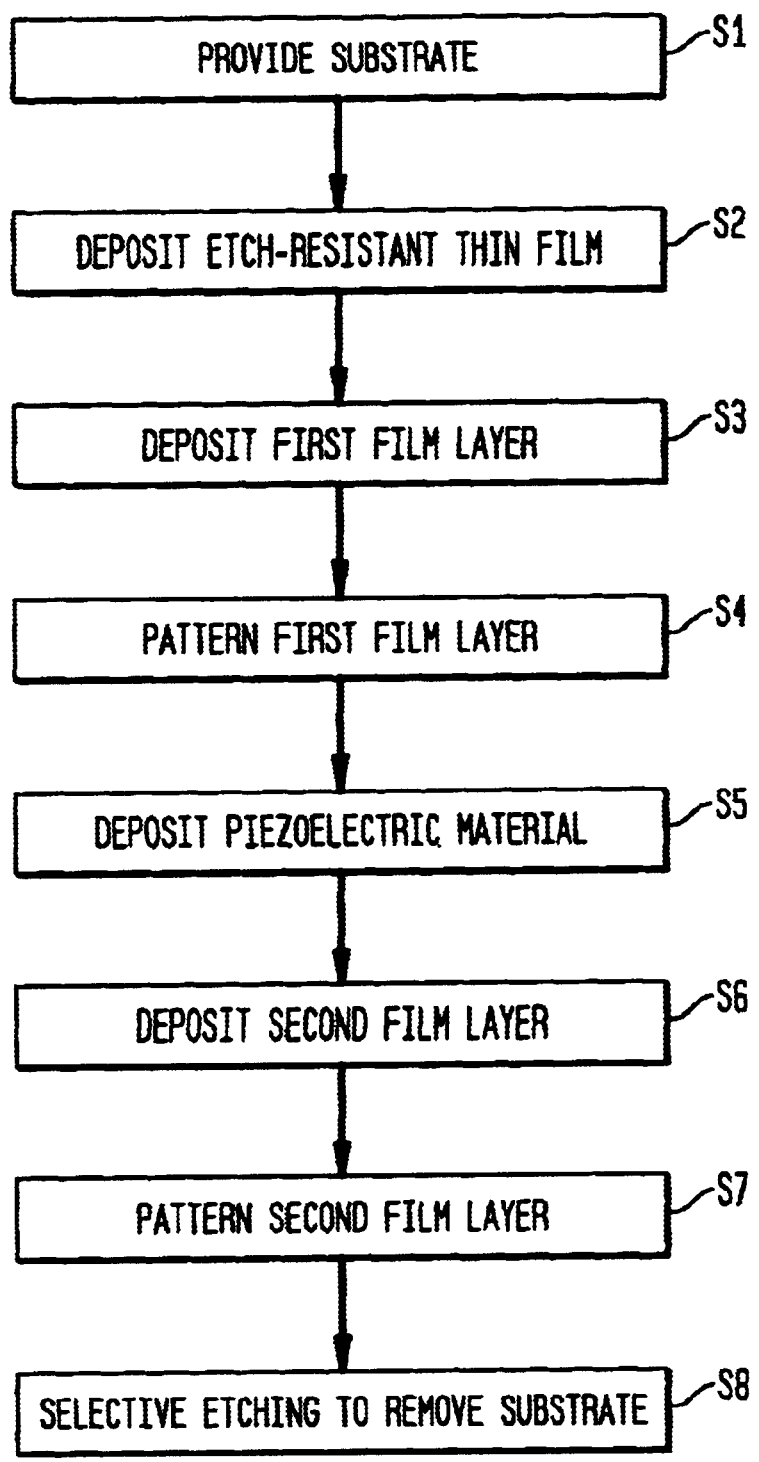
FIG. 3 describes a manufacturing method in accordance with the present application.

FIG. 3 illustrates the method of manufacturing an electronic device such as a TFR in accordance with the present application. Though there can be a variety of thin film process steps involved in the batch fabrication of a TFR device (as there is in fabricating any modern integrated circuit or electronic device), the vast majority of these processes involve repeated applications of three primary operations: deposition, lithography, and etching.

Referring to FIG. 3, initially a base support structure such as a substrate is provided (Step S1). In conventional devices, the base structure is often not integral to device operation; it provides only mechanical support. The base structure in the present embodiment, hereinafter "substrate" is preferably a silicon wafer substrate. Alternatively, the substrate may include a plurality of alternating reflecting layers of acoustically mismatched materials such as $SiO_2$ and AlN that are deposited on a wafer substrate of silicon, quartz, or glass wafer. This process is now described in more detail below, and illustrates one aspect as to how the detrimental effects of parasitics may be eliminated.

After providing the substrate, a thin, etch resistant film or membrane is applied to the substrate (Step S2). This film may be a thin layer of AlN or SiN, for example, and may act as the supporting membrane. This film is preferably applied by chemical vapor deposition (CVD), but may also be applied with techniques such as physical vapor deposition (PVD), evaporation, etc., or application techniques familiar to one practiced in the art. Alternatively, and as noted above, a thin film that is integral to the device may ultimately serve as the substrate (membrane). For example, in fabricating a TFR, the piezoelectric material (AlN) may serve a dual role as the supporting membrane, sandwiched by conductor or electrode layers attached thereto.

Next, a thin metal film layer (approximately 100 nanometers or $100 \times 10^{-9}$ meters thick) is deposited on the substrate surface (Step S3). This deposition may preferably be performed in a vacuum chamber using one of the above-described plurality of thin-film deposition techniques. In the present embodiment, this metal film acts as a bottom surface electrode for the TFR and is preferably composed of Al, but other conductors may be used as well. This deposition may preferably be performed in a vacuum chamber using one of a variety of thin-film deposition techniques, as described above.

Once the metal film has been deposited, it undergoes a patterning process (Step S4). A lithographic process is employed in which a thin layer of a photo-sensitive, chemically-resistant polymer, or "photo resist", is applied to completely coat the metal film. Exposure to light through a "photo mask", a material or masking layer that has holes or openings at certain locations for light to pass, sensitizes the photo resist such that subsequent immersion in a developer removes only that resist material that was subject to the light. At this point, the sample surface consists of regions where the protective resist layer remains, and regions of un-protected metal. This extent or nature of this patterning process may be based on the desired application; i.e., in TFR applications, this patterning is determined by the design of the desired or required filter.

The base or bottom electrode patterning process continues with the transfer of this lithographically-defined pattern into the metal layer via an etching process. A number of etching techniques are routinely practiced in the art, including wet chemical etching (KOH), dry or reactive ion etching (RIE), and sputter etching. Such processes, through either chemical or physical action, remove any metal which is unprotected by the photo resist, while leaving the resist-coated metal intact, thereby "sculpting" the metallic surface into the desired electrode pattern.

Figure 4:
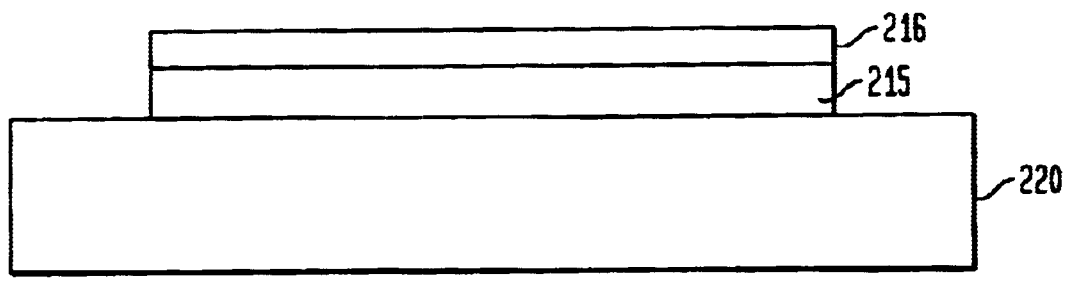
FIG. 4 illustrates a partially fabricated TFR device.

An electrode defined by such a process is illustrated in FIG. 4. Resist 216 has protected metal layer 215 during the removal of all unprotected material on substrate 220. When the remaining photo resist material 216 is removed by a solvent or polymer etching process, a metallic layer 215 defined by the desired pattern remains. The semi-completed device is then returned to the vacuum chamber for the deposition of some type of intermediate film (Step S5). In the present embodiment, this is an active piezoelectric material film.

Similar to the metal deposition alternatives listed above, the piezoelectric layer can be deposited in different ways, such as through RF sputtering of an insulating target, pulsed DC reactive sputtering of a metallic target, chemical vapor deposition (CVD) and molecular beam epitaxy (MBE) for example. This piezoelectric material is preferably Aluminum Nitride (AlN) as in the presently described embodiment, but may be composed of ZnO or CdS for example. Similar to the metal film, the AlN film is deposited entirely over the substrate, but unlike the metal film it is not patterned in this embodiment.

The intermediate film is subsequently coated with a second thin metal film layer of Al or other suitable conductor, so as to form the top electrode of the device (Step S6). This second metal film is patterned and etched (Step S7) with the lithographic process as described above in Step S4. Once the photo resist is removed, the structure of the device is almost complete.

The final step in the device's fabrication consists of masking the substrate for selective removal of at least some, or even all of the substrate material underlying the device. After masking, the exposed Si may be etched with either wet (KOH, for example) or dry (RIE) chemistry (Step S8). This Si etch terminates on the initially-deposited etch-resistant film or a film which is integral to device operation (i.e., AlN, SiN or ZnO for example), as is appropriate for the desired device or application.

Figure 5A:
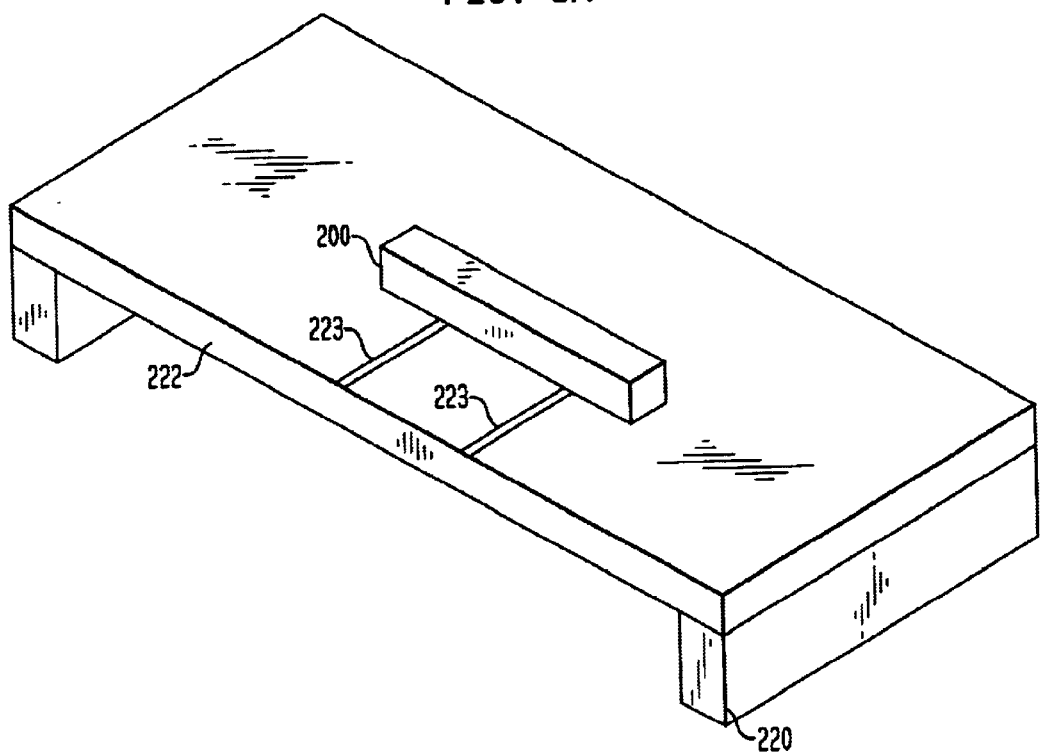
FIG. 5(a) illustrates an electronic device supported by a non-integral membrane structure.
Figure 5B:
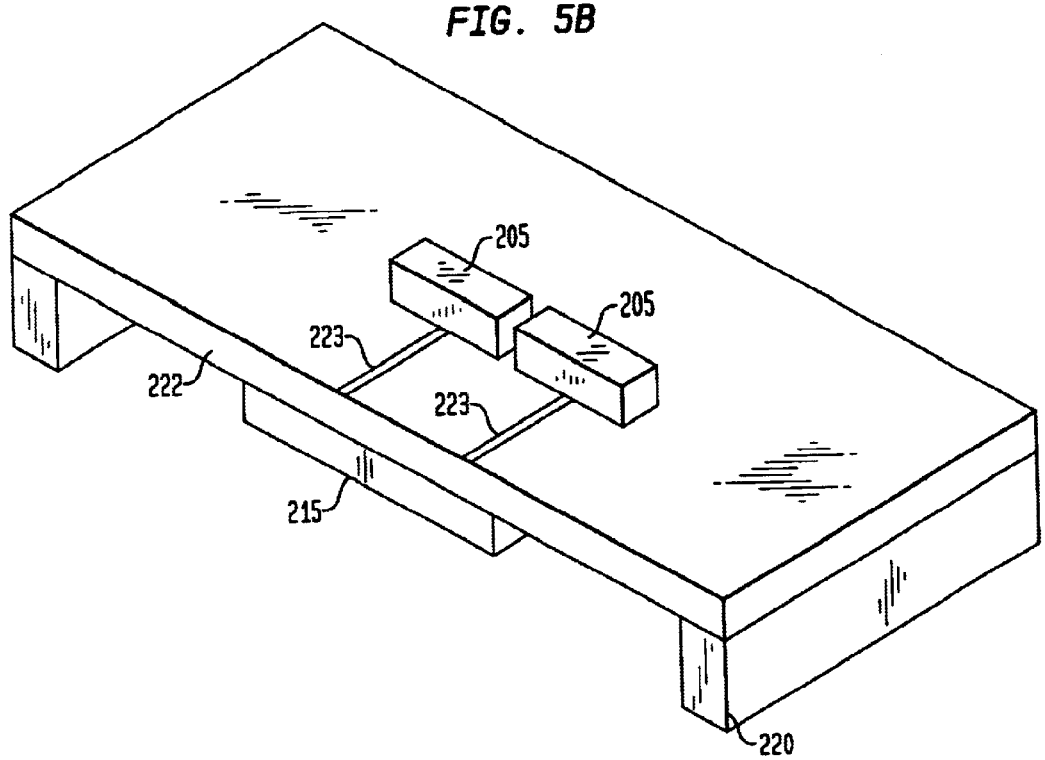
FIG. 5(b) illustrates an electronic device in which the supporting membrane is an integral part of the circuit.

FIGS. 5(a) and 5(b) illustrate two exemplary embodiments of a membrane-supported electronic device. FIG. 5(a) illustrates a device supported by a non-integral membrane; the membrane acts only as a mechanical support structure. Referring to FIG. 5(a), the membrane 222 is in fact the etch-resistant film of Step S2 in FIG. 3. Film 222 results from the removal of substrate 220, and spans the un-etched remnants of the Si substrate 220 to support a device 200, but does not form an integral part of that device 200. It is noted that some residual Si may remain, hence "remnants", even after material is removed by selective etching. Wires or leads 223 patterned as part of the device fabrication process carry electronic signals to and from the device 200.

FIG. 5(b) illustrates a device in which the supporting membrane is an integral part of the device. Note that, in the latter figure, no membrane film deposition (as described in step S2 of FIG. 3) would be required. Referring to FIG. 5(b), a membrane 222 spanning the un-etched remnants of the Si substrate 220 supports material on both its faces (top electrodes 205 and bottom electrode 215) and, as in the case of a TFR 200, communication between the top and bottom mounted electrodes is accomplished through the membrane 222. The membrane, in this case, is an integral part of the device and may be made of piezoelectric material such as AlN and SiN, for example, or any other known materials which have piezoelectric properties. The electrodes 205 and 220 remain supportably attached to film 222 due to inherently strong bonding properties occurring between the layers, as is known to those skilled in the art. Wires or leads 223, which may be patterned as part of the device fabrication process, carry the electronic signal to and from the device, such as via top electrodes 205 as shown in FIG. 5(b).

Figure 6:
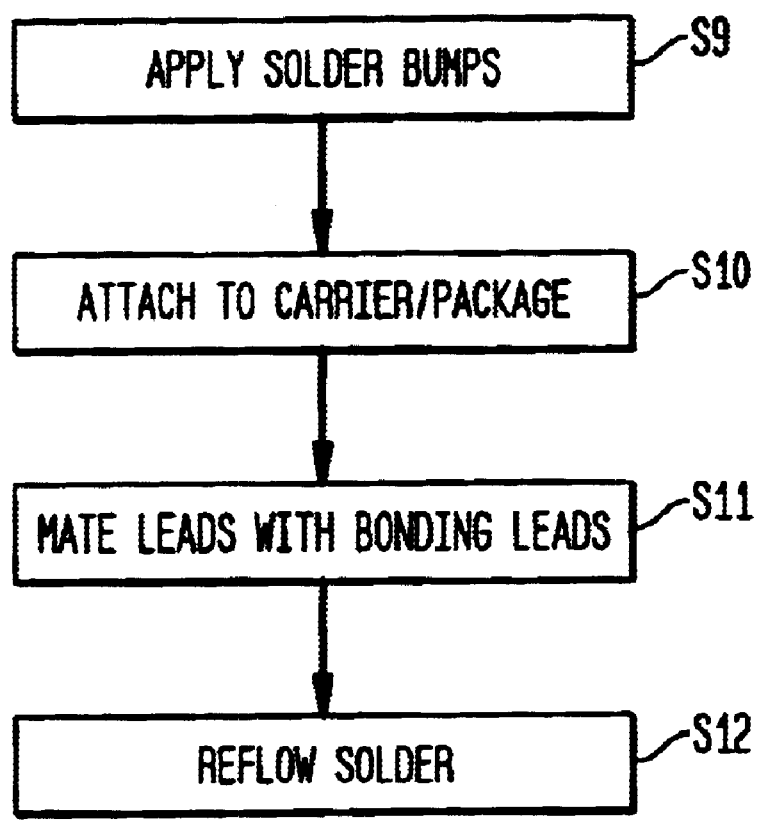
FIG. 6 describes a mounting method in accordance with the present application.
Figure 7:
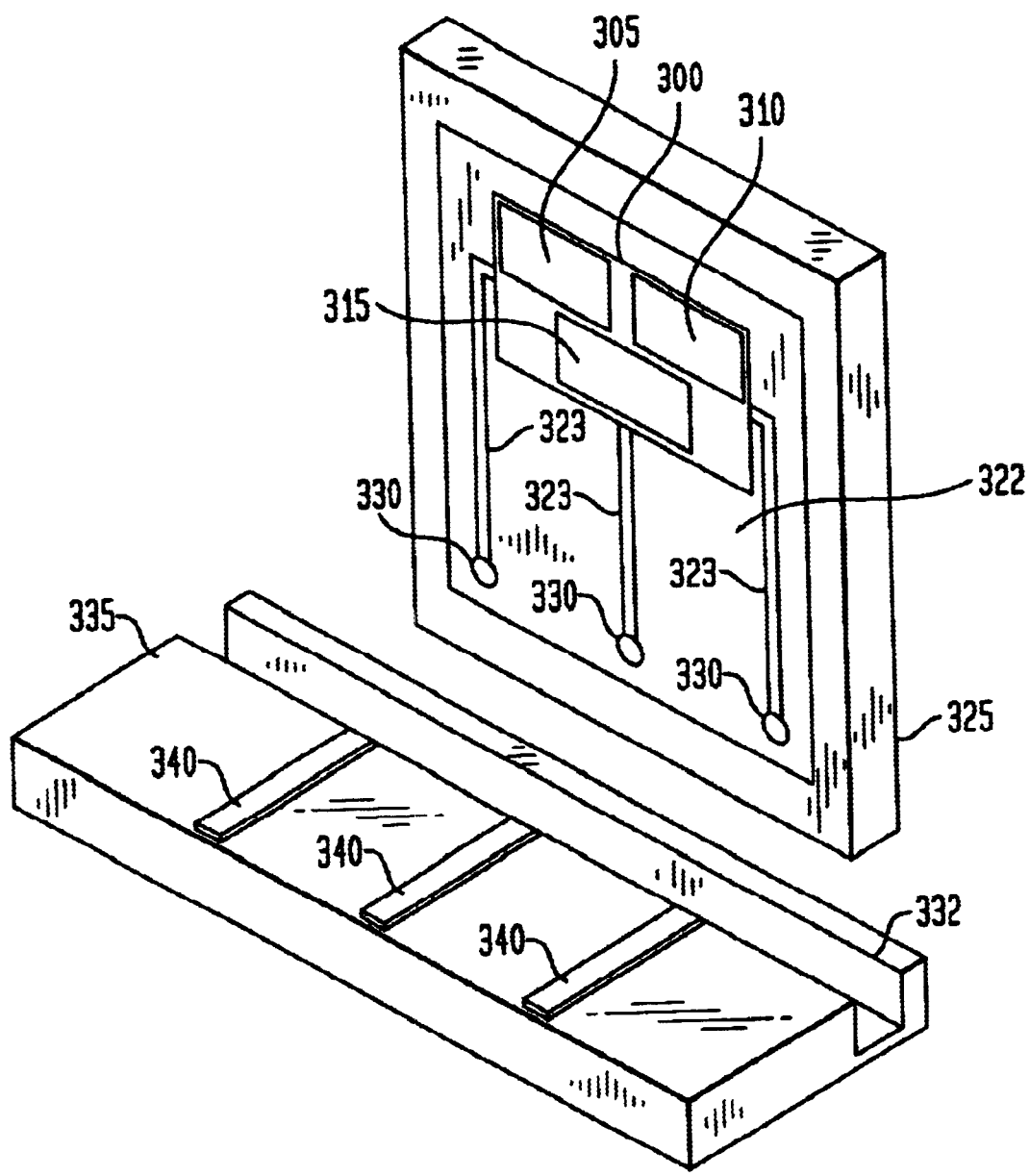
FIG. 7 illustrates the manufactured device and a carrier in accordance with a mounting method of FIG. 6.

FIGS. 6 describes steps of the mounting technique of the present application: FIG. 7 illustrates the membrane-mounted device attached to a carrier in accordance with a mounting technique described in FIG. 6. In general, a completed device such as shown in FIGS. 5(a) and/or 5(b) would be inserted into a carrier or package assembly, or even another integrated circuit, for example. Solder bumps that had been previously applied to the electrodes of the device would then be reflowed (melted) to create an electrical connection to the carrier. A surface of the carrier on which the device is attached or connected may then be configured with, or contain circuitry thereon to tune out any residual parasitics (capacitances or inductances) that may still be present in the device.

In the exemplary arrangement as shown in FIG. 7, after fabrication of the TFR device 300, solder bumps are applied to the electrodes (step S9 in FIG. 6). In FIG. 7, there is illustrated a TFR device 300 in a T-Cell configuration on top of membrane 322 that rests on die 325. Leads 323 (i.e., leads from the metal electrodes of the device) extend from series resonators 305 and 310 and shunt resonator 315 respectively to the edge of the membrane 322.

At the ends of these leads 323, corresponding solder bumps (small balls of conductive material) 330 may be provided or applied by conventionally known soldering techniques, or those currently being used in the art. The die 325 may then be attached to a carrier or package (step S10), inserted in an edge-on fashion into a recess 332 that may be provided on a package or carrier 335, as shown in FIG. 7 for example. The die 325 is positioned (step S11) such that the solder bumps 330 contact corresponding bonding leads 340, and then the solder is reflowed (i.e., melted by conventionally known or used heat sources) (step S12) in order to solidify the electrical connections between device 300 and carrier 335. Mounted in this configuration, residual parasitics are substantially negated since, with minimal or no substrate, any possible capacitor or inductor configuration which could be a source of such parasitics (i.e., parallel plates separated by a dielectric) no longer exists, or is minimized to the extent that it does not interfere with device performance.

If required, circuitry for tuning out any residual parasitics can be built or provided on the carrier mounting surface 335. For example, and with the understanding that capacitor reactance is typically a negative reactance and inductor reactance typically a positive reactance, capacitor and/or inductor elements could be added on the surface of the carrier 335 where necessary, between at least one of the bonding leads and ground. Thus, in an exemplary case where there might be residual inductive parasitics present, capacitors may be employed to offset or cancel the positive inductor reactance with a negative capacitor reactance, and vice versa.

The invention being thus described, it will be obvious that the same may be varied in many ways. For example, each of the deposition and patterning steps illustrates in FIG. 3 (steps S3–S7) may be repeated several times in order to build up a device for whatever application is desired. Such variations are not to be regarded as a departure from the spirit and scope of the invention, and also to modifications as would be obvious to one skilled in the art or intended to be included within the scope of the following claims.

What is claimed is:

1. A method of producing an electronic device, comprising:

applying an etch-resistant thin film on a substrate;

providing a piezoelectric layer interposed between two conductor layers that are supported by the substrate; and removing at least a portion of the substrate, leaving said etch-resistant thin film and at least some portion of remaining substrate, said etch-resistant thin film and remaining substrate configured as a suspended membrane supporting the conductor layers and piezoelectric layer.

2. The method of claim 1, further comprising performing a series of patterning and deposition processes to shape the substrate and build-up additional integral conductor layers with piezoelectric layers between conductor layers, prior to removing said at least a portion of said substrate by a selective etching process.

3. The method of claim 2, further comprising:

applying a plurality of solder bumps to ends of leads extending from said conductors, wherein said leads are arranged on a die that supports the electronic device.

4. The method of claim 2, wherein said selective etching process includes masking the substrate for selective removal of at least a portion of the substrate, and then etching the exposed substrate portion using a potassium hydroxide (KOH) or reactive ion etching (RIE) process.

5. The method of claim 2, wherein said step of removing substantially negates or eliminates parasitic capacitances or parasitic inductances present in the device, as these parasitic capacitances or parasitic inductances are removed with the substrate.

6. The method of claim 1, wherein the remaining substrate is essentially immune to the effects of parasitic capacitance and inductance.

7. The method of claim 1, wherein said conductor layers are formed by lithographic patterning of Al metal or other conductors.

8. The method of claim 1, wherein said substrate is a wafer formed of silicon, quartz, or glass.

9. The method of claim 1, wherein said etch-resistant thin film is at least one film selected from a group consisting of AlN, SiN and ZnO films.

10. The method of claim 1, wherein said applying further includes applying the etch-resistant film by at least one thin film deposition process selected from the group consisting of physical vapor deposition (PVD), chemical vapor deposition (CVD), and thermal evaporation processes.

11. The method of claim 1, wherein said electronic device is a thin film resonator (TFR) device.

12. The method of claim 1, wherein said applying includes applying the etch-resistant film on top of the substrate, so that substantially all of the substrate is removed beneath the etch-resistant film.

13. A thin film resonator (TFR) device produced by the method of claim 1.

14. A method of mounting an electronic device suspended on a membrane, comprising:

providing a piezoelectric layer between at least two conductor layers on a substrate, said substrate having an etch resistant film thereon that acts as a barrier to allow removal of substantially all of said substrate to form a membrane that supports said piezoelectric and conductor layers;

applying a plurality of solder bumps to ends of leads extending from conductors of the electronic device, said leads arranged on a die that supports the electronic device;

attaching the die to a package so that said solder bumps contact corresponding bonding leads on said package.

15. The method of claim 14, further comprising melting the solder bumps to effect electrical connection to the package.

16. The method of claim 14, wherein the electronic device, as mounted, is configured so that the effects of any residual parasitic capacitances and parasitic inductances are negated or limited.

17. The method of claim 14, wherein said etch-resistant thin film is at least one film selected from a group consisting of AlN, SiN and ZnO films.

18. The method of claim 14, wherein said etch-resistant film is applied on the substrate by at least one thin film deposition process selected from a group consisting of PVD, CVD, and thermal evaporation processes.

19. The method of claim 13, wherein said electronic device is a thin film resonator (TFR) device.

20. A method of producing an electronic device that is suspended in a membrane, the electronic device including a piezoelectric layer interposed between at least two conductor layers, comprising:

providing an etch-resistant thin film on a substrate;

performing a series of patterning and deposition processes to shape the substrate and build-up integral conductor layers with piezoelectric layers between conductor layers; and removing substantially all of the substrate material so that the etch-resistant thin film forms the membrane, the etch resistant film acting as a barrier to permit removal of substantially all of said substrate, thereby forming the membrane, the membrane supporting said piezoelectric layers and conductor layers.

21. The method of claim 20, wherein any remaining substrate material is essentially immune to the effects of parasitic capacitance and inductance.

22. The method of claim 20, wherein said etch-resistant thin film is at least one film selected from a group consisting of AlN, SiN and ZnO films.

23. The method of claim 20, wherein said etch-resistant film is applied by at least one thin film deposition process selected from a group consisting of PVD, CVD, and thermal evaporation processes.

24. The method of claim 20, wherein said electronic device is a thin film resonator (TFR) device.

25. The method of claim 20, wherein said step of removing substantially negates or eliminates parasitic capacitances or parasitic inductances from being present in the device, as these parasitic capacitances or parasitic inductances are removed with the substrate.

26. A thin film resonator (TFR) device produced by the method of claim 20.

* * * * *

UNITED STATES PATENT AND TRADEMARK OFFICE
CERTIFICATE OF CORRECTION

PATENT NO. : 6,675,450 B1
DATED : January 13, 2004
INVENTOR(S) : Linus A. Fetter et al.

It is certified that error appears in the above-identified patent and that said Letters Patent is hereby corrected as shown below:

<u>Title page,</u>
Item [73], Assignee, should read -- Agere Systems, Inc. --.

Signed and Sealed this

Seventeenth Day of February, 2004

JON W. DUDAS
*Acting Director of the United States Patent and Trademark Office*